(12) United States Patent
Lee et al.

(10) Patent No.: US 12,294,044 B2
(45) Date of Patent: *May 6, 2025

(54) DISPLAY DEVICE AND METHOD OF MANUFACTURING THE SAME

(71) Applicant: Samsung Display Co., LTD., Yongin-si (KR)

(72) Inventors: Dae Geun Lee, Hwaseong-si (KR); Joon Sam Kim, Hwaseong-si (KR); Suk Ho Choi, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/427,129

(22) Filed: Jan. 30, 2024

(65) Prior Publication Data

US 2024/0194846 A1    Jun. 13, 2024

Related U.S. Application Data

(63) Continuation of application No. 17/179,808, filed on Feb. 19, 2021, now Pat. No. 11,908,985.

(30) Foreign Application Priority Data

Feb. 20, 2020   (KR) .................. 10-2020-0020916

(51) Int. Cl.
*H01L 33/62*   (2010.01)
*H01L 27/15*   (2006.01)
(Continued)

(52) U.S. Cl.
CPC ............ *H01L 33/62* (2013.01); *H01L 27/156* (2013.01); *H01L 33/005* (2013.01); *H01L 33/38* (2013.01); *H01L 2933/0066* (2013.01)

(58) Field of Classification Search
CPC ..... H01L 33/62; H01L 27/156; H01L 33/005; H01L 33/38; H01L 2933/0066; G02F 1/13452; G02F 1/13458; H10K 59/131
See application file for complete search history.

(56) References Cited

U.S. PATENT DOCUMENTS

2015/0314396 A1* 11/2015 Watanabe .......... B23K 35/0222
                                                              228/249
2017/0194248 A1*  7/2017 Das ................... H01L 23/49827
(Continued)

FOREIGN PATENT DOCUMENTS

KR         1998-072407      11/1998
KR      10-2006-0087952      8/2006
(Continued)

*Primary Examiner* — Ratisha Mehta
(74) *Attorney, Agent, or Firm* — KILE PARK REED & HOUTTEMAN PLLC

(57) ABSTRACT

A display device may include a display panel including a pad disposed on a substrate and a driving unit including a bump electrically connected to the pad. The pad may include a first layer disposed on the substrate and including a conductive material, a second layer disposed on the first layer and including patterns arranged in a first direction and spaced apart from each other, and a third layer disposed on the second layer and including a conductive material. The first layer may include portions protruding toward the substrate and respectively corresponding to the patterns.

20 Claims, 5 Drawing Sheets

⟶ DR1

(51) Int. Cl.
   *H01L 33/00*     (2010.01)
   *H01L 33/38*     (2010.01)

(56) References Cited

U.S. PATENT DOCUMENTS

| | | | |
|---|---|---|---|
| 2017/0358642 A1* | 12/2017 | Jo | ............... H10K 59/131 |
| 2017/0365653 A1* | 12/2017 | Kim | ............... G02F 1/13458 |
| 2017/0373028 A1* | 12/2017 | Ryu | ............... H10K 59/131 |
| 2019/0252481 A1 | 8/2019 | Kim et al. | |
| 2020/0027837 A1* | 1/2020 | Jeng | ............... H01L 23/3135 |
| 2020/0163246 A1* | 5/2020 | Yueh | ............... H05K 7/1451 |
| 2021/0091167 A1 | 3/2021 | Kim et al. | |

FOREIGN PATENT DOCUMENTS

| | | |
|---|---|---|
| KR | 10-2018-0000046 | 1/2018 |
| KR | 10-2019-0098878 | 8/2019 |

* cited by examiner

DISPLAY DEVICE AND METHOD OF MANUFACTURING THE SAME

CROSS-REFERENCE TO RELATED APPLICATION

This is a continuation application of U.S. patent application Ser. No. 17/179,808 filed Feb. 19, 2021 (now U.S. Pat. No. 11,908,985 which issued on Feb. 20, 2024) the disclosure of which is incorporated herein by reference in its entirety. U.S. patent application Ser. No. 17/179,808 claims priority to and benefits of Korean Patent Application No. 10-2020-0020916 under 35 U.S.C. § 119, filed Feb. 20, 2020, in the Korean Intellectual Property Office, the entire contents of which are incorporated herein by reference.

BACKGROUND

1. Technical Field

The disclosure generally relates to a display device, and more specifically, to a display device including a driving unit and a method of manufacturing the display device.

2. Description of the Related Art

Importance of a display device has been increasing with the development of multimedia. In general, various display devices such as an organic light emitting display device, a liquid crystal display device, or the like have been used. The display device may include a display panel for displaying an image.

The display device may further include a driving unit for supplying a signal, voltage, or the like to the display panel in order to drive the display panel. The driving unit may include a bump that is a terminal connected to an external element. The driving unit may be connected to a pad that is a terminal of the display panel through the bump. The display panel may be electrically connected to the driving unit and may receive a signal, voltage, or the like from the driving unit.

It is to be understood that this background section is, in part, intended to provide useful background for understanding the technology. However, this background section may also include ideas, concepts, or recognitions that were not part of what was known or appreciated by those of ordinary skill in the pertinent art prior to a corresponding effective filing date of the subject matter disclosed herein.

SUMMARY

Some embodiments of the invention provide a display device, wherein a contact portion between a pad and a bump may be visually recognizable.

Some embodiments provide a method of manufacturing a display device, wherein a pad and a bump may be electrically connected without damaging a display panel.

A display device according to an embodiment may include a display panel including a pad disposed on a substrate and a driving unit including a bump electrically connected to the pad. The pad may include a first layer disposed on the substrate, the first layer including a conductive material, a second layer disposed on the first layer, the second layer including patterns arranged in a first direction and spaced apart from each other, and a third layer disposed on the second layer, the third layer including a conductive material. The first layer may include portions protruding toward the substrate and respectively corresponding to the patterns.

In an embodiment, the second layer may include an insulation material.

In an embodiment, the second layer may include at least one of silicon nitride, silicon oxide, and silicon oxynitride.

In an embodiment, the second layer may include a conductive material.

In an embodiment, the second layer may includes at least one of molybdenum (Mo) and copper (Cu).

In an embodiment, a width of each of the patterns in the first direction may be greater than or equal to about 3 μm.

In an embodiment, widths of the patterns in the first direction may be equal to each other.

In an embodiment, a width of each of the patterns in a second direction intersecting the first direction may be equal to a width of the first layer in the second direction.

In an embodiment, widths of the patterns in a second direction intersecting the first direction may be equal to each other.

In an embodiment, a gap between adjacent patterns of the patterns in the first direction may be greater than or equal to a width of each of the patterns in the first direction.

In an embodiment, a thickness of the second layer may be in a range from about 1000 Å to about 10000 Å.

In an embodiment, the third layer may include at least one of aluminum (Al), titanium (Ti), and copper (Cu).

In an embodiment, the display device may further include a connection layer electrically connecting the bump to the pad and including a mixture of a material of the pad and a material of the bump.

In an embodiment, the display device may further include a transistor including an active layer disposed on the substrate, a gate electrode disposed on the active layer, an insulation interlayer disposed on the gate electrode, and a source-drain electrode disposed on the insulation interlayer and electrically connected to the active layer.

In an embodiment, the first layer and the gate electrode may be disposed on a same layer; the second layer and the insulation interlayer may be disposed on a same layer; and the third layer and the source-drain electrode may be disposed on a same layer. The first layer, the second layer, and the third layer may be disposed on different layers.

In an embodiment, the display device may further include a capacitor including the gate electrode and a capacitor electrode disposed between the gate electrode and the insulation interlayer.

In an embodiment, the first layer and the gate electrode may be disposed on a same layer; the second layer and the capacitor electrode may be disposed on a same layer; and the third layer and the source-drain electrode may be disposed on a same layer. The first layer, the second layer, and the third layer may be disposed on different layers.

A method of manufacturing a display device according to an embodiment may include forming a pad including: forming a first layer on a substrate, the first layer including a conductive material, forming a second layer on the first layer, the second layer including a patterns arranged in a first direction and spaced apart from each other, and forming a third layer on the second layer, the third layer including a conductive material, contacting a bump to the third layer of the pad, and electrically connecting the bump to the pad with a direct bonding.

In an embodiment, the forming of the first layer may include forming the first layer to be flat before electrically connecting the bump to the pad, and forming portions of the first layer protruding toward the substrate after electrically connecting the bump to the pad, the portions respectively corresponding to the patterns.

In an embodiment, the forming of the third layer may include forming portions of the third layer protruding toward the bump before electrically connecting the bump to the pad, the portions respectively corresponding to the plurality of patterns, and forming the third layer to be flatter after electrically connecting the bump to the pad than before electrically connecting the bump to the pad.

In the display device according to the embodiments, the portions of the first layer of the pad respectively corresponding to the patterns of the second layer of the pad may protrude toward the substrate, so that the contact portion between the pad and the bump may be visually recognizable.

In the method of manufacturing the display device according to some embodiments, the pad including the first layer, the second layer including the patterns, and the third layer may contact the bump, and the bump may be electrically connected to the pad with the direct bonding without damaging the display panel.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
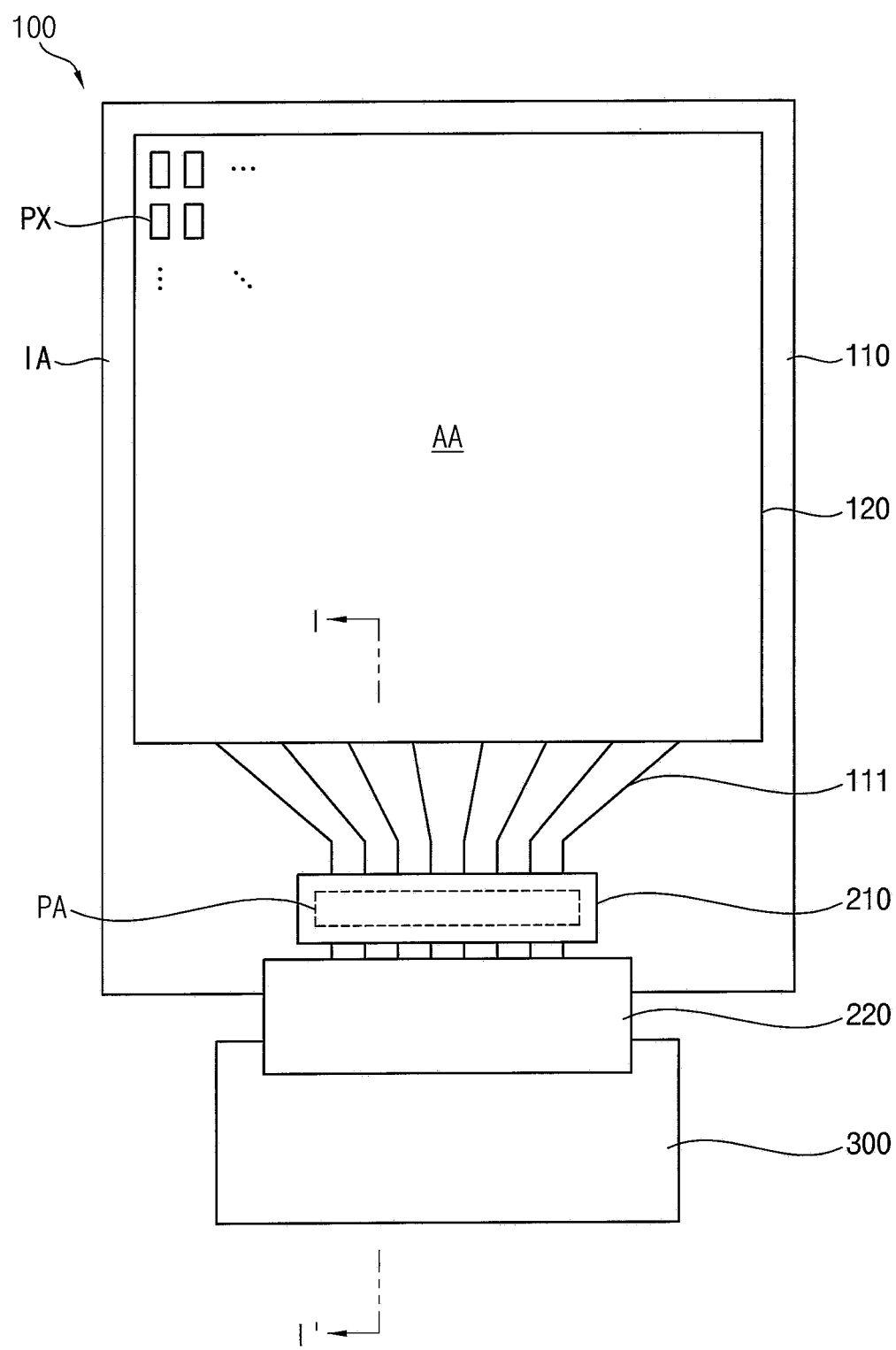
FIG. 1 is a plan view illustrating a display device according to an embodiment.

Embodiments of the invention will be described hereinafter with reference to the accompanying drawings. Although the invention may be modified in various manners and have additional embodiments, embodiments are illustrated in the accompanying drawings and will be described in the specification. However, the scope of the invention is not limited to the embodiments in the accompanying drawings and the specification and should be construed as including all the changes, equivalents and substitutions included in the spirit and scope of the invention.

In the drawings, sizes and thicknesses of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Further, "over" or "on" may include positioning on or below an object and does not necessarily imply a direction based upon gravity.

The term "overlap" as used herein may include layer, stack, face or facing, extending over, covering or partly covering or any other suitable term as would be appreciated and understood by those of ordinary skill in the art. The term "do not overlap" as used herein may include "apart from" or "set aside from" or "offset from" and any other suitable equivalents as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes," and/or "including" are used in this specification, they or it may specify the presence of stated features, integers, steps, operations, elements and/or components, but does not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first layer" is discussed in the description, it may also be termed "a second layer" or "a third layer" in the claims, and "a second layer" and "a third layer" may be termed in a similar manner without departing from the teachings herein.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
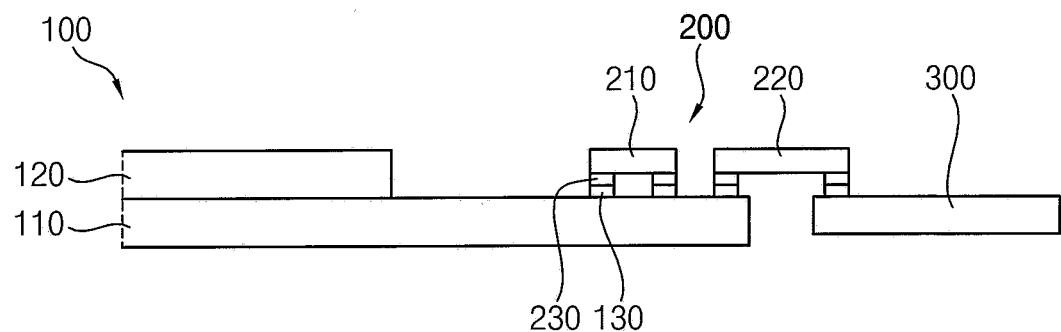
FIG. 2 is a schematic cross-sectional view taken along line I-I' of FIG. 1.

FIG. 1 is a plan view illustrating a display device according to an embodiment. FIG. 2 is a schematic cross-sectional view taken along line I-I' of FIG. 1.

Referring to FIGS. 1 and 2, a display device according to an embodiment may include a display panel 100, a driving unit 200, and a circuit board 300. In an embodiment, the display panel 100 may be an organic light emitting display panel. However, the display panel 100 is not limited thereto, and in another embodiment, the display panel 100 may be a liquid crystal display panel, a field emission display panel, an electronic paper display panel, or the like.

The display panel 100 may include a display substrate 110 and an encapsulation layer 120 disposed on the display substrate 110. The display panel 100 may further include functional layers such as a polarization plate, an input sensing layer, a window, or the like.

The display substrate 110 may include an active area AA and an inactive area IA adjacent to the active area AA. The active area AA may display an image, and the inactive area IA may not display the image. The encapsulation layer 120 may cover or overlap the active area AA.

Pixels PX may be disposed in the active area AA. Each of the pixels PX may emit light, and the image may be displayed in the active area AA based on the light.

The inactive area IA may surround the active area AA. The inactive area IA may include a pad area PA.

The pad area PA may be disposed at or near an edge of the display substrate 110. Pads 130 may be disposed in the pad area PA. The pads 130 may be electrically connected to the wirings 111 extending from the active area AA. The pads 130 may be electrically connected to the driving unit 200.

The driving unit 200 may include a driving circuit and may be a chip-on-plastic (COP). However, the driving unit 200 is not limited thereto. For example, the driving unit 200 may also be a chip-on-film (COF) or a chip-on-glass (COG).

The driving unit 200 may include a driving IC (integrated circuit) 210 disposed on the display substrate 110, a flexible film 220 on which a circuit wiring is patterned, and bumps 230 disposed under the driving IC 210 and the flexible film 220. The driving IC 210 and the flexible film 220 may be electrically connected to each other.

The flexible film 220 may be electrically connected to the circuit board 300. For example, the circuit board 300 may be a flexible printed circuit board (FPCB).

The pads 130 may be electrically connected to the bumps 230. Specifically, the pads 130 may be respectively electrically connected to the bumps 230.

The pad 130 and the bump 230 may be electrically connected to each other through a connection layer. The connection layer is a layer that is formed between the pad 130 and the bump 230 in case that the pad 130 and the bump 230 are electrically connected to each other by a direct bonding, e.g., an ultrasonic bonding. A portion of the pad 130 and a portion of the bump 230 may be diffused toward each other during the direct bonding process and may be thereby coupled to each other. A detailed coupling structure of the pad 130 and the bump 230 will be described below with reference to FIGS. 4, 5, 7, and 8.

Figure 3:
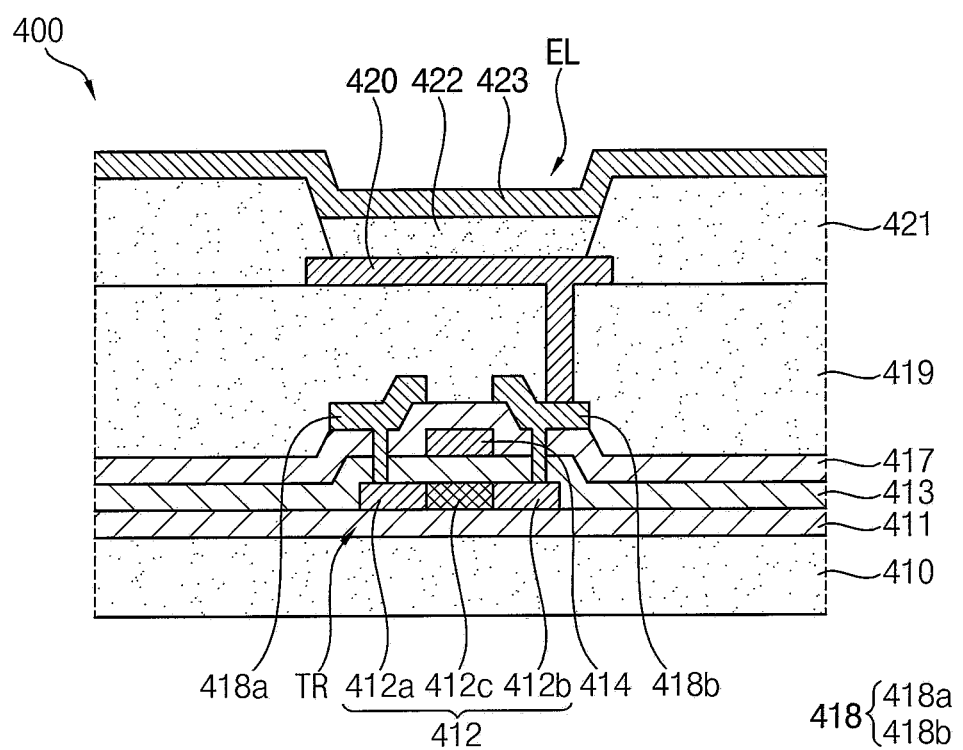
FIG. 3 is a schematic cross-sectional view illustrating a display substrate according to an embodiment.

FIG. 3 is a schematic cross-sectional view illustrating a display substrate according to an embodiment. FIG. 3 may illustrate an example active area AA of the display substrate 110 of FIG. 2.

Referring to FIG. 3, a display substrate 400 according to an embodiment may include a substrate 410 and a transistor TR and a light emitting element EL disposed on the substrate 410.

The substrate 410 may be a flexible glass substrate, a flexible polymer substrate, a rigid glass substrate, a rigid polymer substrate, or the like. The substrate 410 may be transparent, semi-transparent, or opaque.

A buffer layer 411 may be disposed on the substrate 410. The buffer layer 411 may cover an upper surface of the substrate 410. The buffer layer 411 may include an inorganic insulation material or an organic insulation material. The buffer layer 411 may have a single-layer structure or a multilayer structure.

The transistor TR may be disposed on the buffer layer 411. The transistor TR may include an active layer 412, a gate insulation layer 413, a gate electrode 414, an insulation interlayer 417, and a source-drain electrode 418.

The active layer 412 may be disposed on the buffer layer 411. The active layer 412 may include a source region 412a and a drain region 412b, which are formed by doping the active layer 412 with N-type impurities or P-type impurities. The active layer 412 may further include a channel region 412c, which is not doped with any impurities, between the source region 412a and the drain region 412b. In an embodiment, the active layer 412 may include amorphous silicon or polycrystalline silicon. In another embodiment, the active layer 412 may include an oxide semiconductor.

The gate insulation layer 413 may be disposed on the active layer 412. The gate insulation layer 413 may include an inorganic insulation material. For example, the gate insulation layer 413 may include silicon nitride, silicon oxide, silicon oxynitride, or the like. The gate insulation layer 413 may have a single-layer structure or a multilayer structure.

The gate electrode 414 may be disposed on the gate insulation layer 413. The gate electrode may overlap the channel region 412c of the active layer 412. The gate electrode 414 may include a conductive material. For example, the gate electrode 414 may include molybdenum (Mo), copper (Cu), or the like. The gate electrode 414 may have a single-layer structure or a multilayer structure.

The insulation interlayer 417 may be disposed on the gate electrode 414. The insulation interlayer 417 may include an inorganic insulation material. For example, the insulation interlayer 417 may include silicon nitride, silicon oxide, silicon oxynitride, or the like. The insulation interlayer 417 may have a single-layer structure or a multilayer structure.

The source-drain electrode 418 may be disposed on the insulation interlayer 417. The source-drain electrode 418 may include a source electrode 418a and a drain electrode 418b. The source electrode 418a and the drain electrode 418b may be electrically connected to the source region 412a and the drain region 412b of the active layer 412, respectively. Contact holes may be formed by removing portions of the gate insulation layer 413 and portions of the insulation interlayer 417. The source electrode 418a and the drain electrode 418b may contact the source region 412a and the drain region 412b of the active layer 412, respectively, through the contact holes.

The source electrode 418a and the drain electrode 418b may include a conductive material. For example, the source electrode 418a and the drain electrode 418b may include aluminum (Al), titanium (Ti), copper (Cu), or the like. The source electrode 418a and the drain electrode 418b may have a single-layer structure or a multilayer structure. For example, the source electrode 418a and the drain electrode 418b may have a structure in which titanium (Ti), aluminum (Al), and titanium (Ti) are stacked (or laminated).

A protective layer 419 may be disposed on the source electrode 418a and the drain electrode 418b. The protective layer 419 may include an inorganic insulation material such as silicon nitride, silicon oxide, silicon oxynitride, or the like and/or an organic insulation material such as polyimide or the like. The protective layer 419 may have a single-layer structure or a multilayer structure. For example, the protective layer 419 may include a passivation layer including the inorganic insulation material and a planarization layer disposed on the passivation layer and including the organic insulation material.

The light emitting element EL may be disposed on the protective layer 419. The light emitting element EL may be electrically connected to the transistor TR. The light emitting element EL may include a first electrode 420, an emission layer 422, and a second electrode 423.

The first electrode 420 may be disposed on the protective layer 419. The first electrode 420 may be electrically connected to the drain electrode 418b. A contact hole may be formed by removing a portion of the protective layer 419, and the first electrode 420 may contact the drain electrode 418b through the contact hole.

The first electrode 420 may serve as an anode, and may be formed of various conductive materials. The first electrode 420 may be a transparent electrode or a reflective electrode. For example, in case that the first electrode 420 is the transparent electrode, the first electrode 420 may include a transparent conductive layer. In case that the first electrode 420 is the reflective electrode, the first electrode 420 may include a reflective layer and a transparent conductive layer disposed on the reflective layer. In an embodiment, the first electrode 420 may have a structure in which indium tin oxide (ITO), silver (Ag), and indium tin oxide (ITO) are stacked (or laminated).

A pixel defining layer 421 may be disposed on the protective layer 419. The pixel defining layer 421 may cover a portion of the first electrode 420. In an embodiment, the pixel defining layer 421 may surround an edge of the first electrode 420 to define an emission area of each of the pixels PX (also refer to FIG. 1). The first electrode 420 may be patterned for each of the pixels PX. The pixel defining layer 421 may include an inorganic insulation material or an organic insulation material. The pixel defining layer 421 may have a single-layer structure or a multilayer structure.

The emission layer 422 may be disposed on the first electrode 420 exposed by the pixel defining layer 421. The emission layer 422 may include at least one of an organic light emitting material and a quantum dot.

In an embodiment, the organic light emitting material may include a low molecular organic compound or a high molecular organic compound. For example, the low molecular organic compound may include copper phthalocyanine, diphenylbenzidine (N,N'-diphenylbenzidine), trihydroxyquinoline aluminum (tris-(8-hydroxyquinoline)aluminum), or the like. The high molecular organic compound may include poly ethylenedioxythiophene (poly(3,4-ethylenedioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, and a combination thereof. In an embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The second electrode 423 may be disposed on the emission layer 422. The second electrode 423 may serve as a cathode, and may be formed of various conductive materials. The second electrode 423 may be a transparent electrode or a reflective electrode. For example, in case that the second electrode 423 is the transparent electrode, the second electrode 423 may include a metal layer and a transparent conductive layer disposed on the metal layer. In case that the second electrode 423 is the reflective electrode, the second electrode 423 may include a metal layer.

Figure 4:
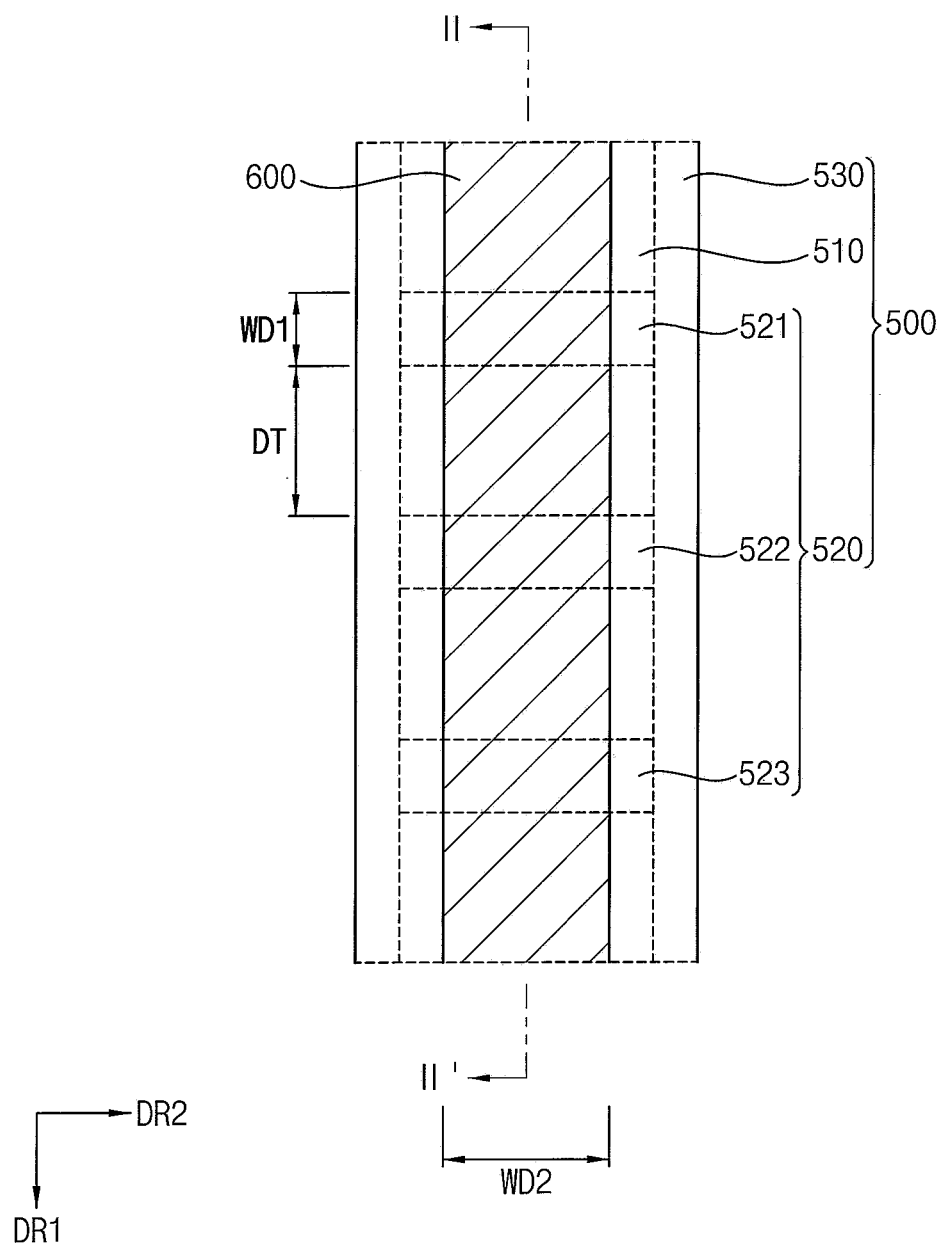
FIG. 4 is a plan view illustrating a pad and a bump according to an embodiment.
Figure 5:
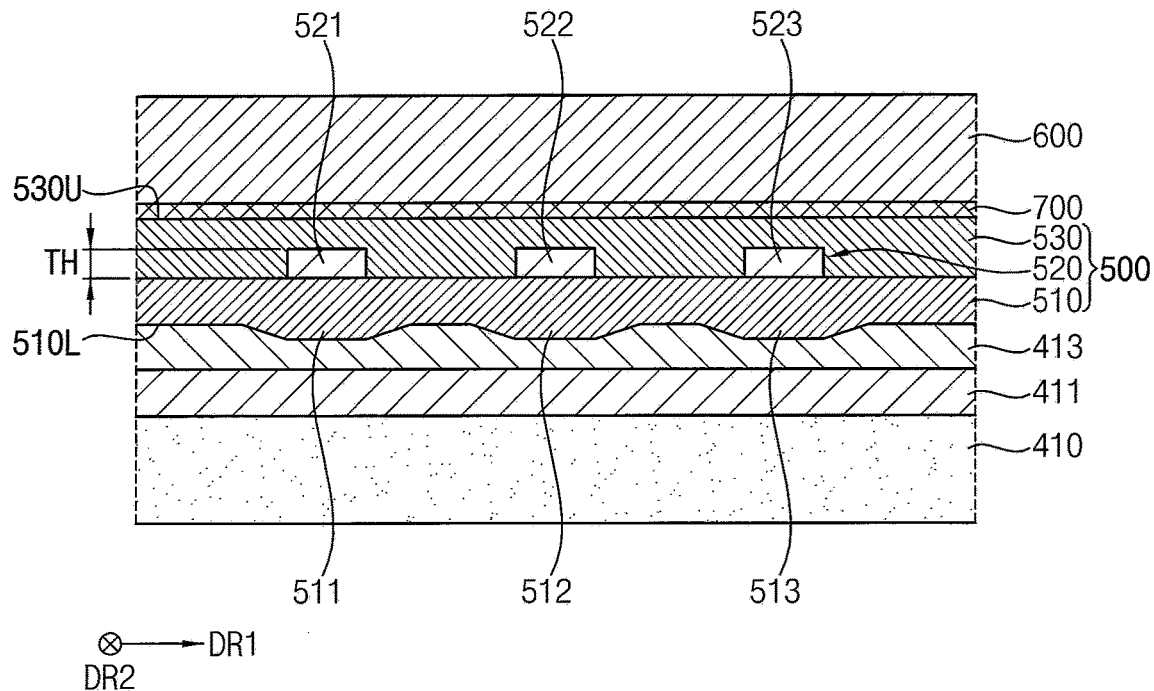
FIG. 5 is a schematic cross-sectional view taken along line II-II' of FIG. 4.

FIG. 4 is a plan view illustrating a pad and a bump according to an embodiment. FIG. 5 is a schematic cross-sectional view taken along line II-II' of FIG. 4.

Referring to FIGS. 4 and 5, a bump 600 of the driving unit 200 of FIG. 2 may be electrically connected to a pad 500 of the display panel 100 of FIG. 2.

The pad 500 may be disposed on the substrate 410 of FIG. 3. The pad 500 may include a first layer 510, a second layer 520, and a third layer 530.

The first layer 510 may be disposed on the substrate 410. In an embodiment, the first layer 510 may be disposed on the gate insulation layer 413. The first layer 510 may extend in a first direction DR1 in a plan view. The first layer 510 may include a conductive material. For example, the first layer 510 may include molybdenum (Mo), copper (Cu), or the like.

The second layer 520 may be disposed on the first layer 510. The second layer 520 may include patterns 521, 522, and 523. The patterns 521, 522, and 523 may be arranged in the first direction DR1 and may be spaced apart from each other.

A width WD1 of each of the patterns 521, 522, and 523 in the first direction DR1 may be greater than or equal to about 3 μm. As will be described below, portions 511, 512, and 513 of the first layer 510 (also refer to FIG. 6) respectively corresponding to the patterns 521, 522, and 523 may protrude toward the substrate 410, so that a contact portion between the pad 500 and the bump 600 may be visually recognizable. Accordingly, because the width WD1 of each of the patterns 521, 522, and 523 in the first direction DR1 is greater than or equal to about 3 μm, the contact portion between the pad 500 and the bump 600 may be visually recognizable with a naked eye or a scope.

In an embodiment, the widths WD1 of the patterns 521, 522, and 523 in the first direction DR1 may be uniform. In other words, the widths WD1 of the patterns 521, 522, and 523 in the first direction DR1 may be substantially equal to each other. However, the invention is not limited thereto, and in another embodiment, the widths WD1 of the patterns 521, 522, and 523 in the first direction DR1 may vary.

A gap DT between adjacent patterns of the patterns 521, 522, and 523 in the first direction DR1 may be greater than or equal to the width WD1 of each of the patterns 521, 522, and 523 in the first direction DR1. For example, the gap DT between adjacent patterns 521, 522, and 523 in the first direction DR1 may be wider than or about at least 1.5 times as wide as the width WD1 of each of the patterns 521, 522, and 523 in the first direction DR1. As will be described below, the portions 511, 512, and 513 of the first layer 510 respectively corresponding to the patterns 521, 522, and 523 may protrude toward the substrate 410, so that the contact portion between the pad 500 and the bump 600 may be visually recognizable. Accordingly, because the gap DT between adjacent patterns of the patterns 521, 522, and 523 in the first direction DR1 is greater than or equal to the width WD1 of each of the patterns 521, 522, and 523 in the first direction DR1, a contact portion between the pad 500 and the bump 600 may be visually recognizable with a naked eye or a scope.

In an embodiment, the gaps DT between the adjacent patterns 521-523 in the first direction DR1 may be uniform. In other words, the gaps DT between the adjacent patterns 521, 522, and 523 in the first direction DR1 may be substantially equal to each other. However, the invention is not limited thereto, and in another embodiment, the gaps DT between the adjacent patterns 521, 522, and 523 in the first direction DR1 may vary.

A width WD2 of each of the patterns 512, 522, and 523 in a second direction DR2 intersecting the first direction DR1 may be substantially equal to a width of the first layer 510 in the second direction DR2. In an embodiment, the widths WD2 of the patterns 512, 522, and 523 in the second direction DR2 may be uniform. In other words, the widths WD2 of the patterns 512, 522, and 523 in the second direction DR2 may be substantially equal to each other. However, the invention is not limited thereto, and in another embodiment, the widths WD2 of the patterns 512, 522, and 523 in the second direction DR2 may vary.

A thickness TH of the second layer 520 may be in a range from about 1000 Å to about 10000 Å. In case that the thickness TH of the second layer 520 is less than about 1000 Å, the portions 511, 512, and 513 of the first layer 510 respectively corresponding to the patterns 521, 522, and 523 protrude toward the substrate 410 in a relatively small degree; and thus the contact portion between the pad 500 and the bump 600 may not be visually recognizable. Further, in case that the thickness TH of the second layer 520 is greater than about 10000 Å, a flatness of an upper surface 530U of the third layer 530 disposed on the second layer 520 may be relatively low (in other words, the upper surface 530U of the third layer 530 may not be relatively flat); and thus a bonding force between the pad 500 and the bump 600 may be relatively small. However, the thickness TH of the second layer 520 may be in a range from about 1000 Å to about 10000 Å, so that the portions 511, 512, and 513 of the first layer 510 respectively corresponding to the patterns 521, 522, and 523 protrude toward the substrate 410 in a relatively large degree; and the contact portion between the pad 500 and the bump 600 may be visually recognizable. Further, the flatness of the upper surface 530U of the third layer 530 disposed on the second layer 520 may be relatively high, and a bonding force between the pad 500 and the bump 600 may be relatively strong.

In an embodiment, the second layer 520 may include an insulation material. For example, the second layer 520 may include an inorganic insulation material such as silicon nitride, silicon oxide, silicon oxynitride, or the like. In another embodiment, the second layer 520 may include a conductive material. For example, the second layer 520 may include a metal such as molybdenum (Mo), copper (Cu), or the like.

The third layer 530 may be disposed on the second layer 520. The third layer 530 may extend in the first direction DR1 in a plan view. In an embodiment, a width of the third layer 530 in the second direction DR2 may be greater than the width of the first layer 510 in the second direction DR2 and the widths WD2 of the patterns 521, 522, and 523 of the second layer 520 in the second direction DR2. The upper surface 530U of the third layer 530 may be substantially flat.

The third layer 530 may include a conductive material. For example, the third layer 530 may include aluminum (Al), titanium (Ti), copper (Cu), or the like.

In an embodiment, the first layer 510 and the gate electrode 414 may be on a same layer; the second layer 520 and the insulation interlayer 417 may be on a same layer; and the third layer 530 of the pad 500 and the source-drain electrode 418 may be disposed on a same layer. In such an embodiment, the first layer 510 and the gate electrode 414 may be formed of a same material, the second layer 520 and the insulation interlayer 417 may be formed of a same material, and the third layer 530 of the pad 500 and the source-drain electrode 418 may be formed of a same material. The first layer, the second layer, and the third layer may be disposed on different layers.

The bump 600 electrically connected to the pad 500 may be disposed on the pad 500. The bump 600 may be disposed on the third layer 530 of the pad 500. The bump 600 may include a conductive material. For example, the bump 600 may include gold (Au) or the like (also refer to FIG. 6).

The portions 511, 512, and 513 of the first layer 510 of the pad 500 respectively corresponding to the patterns 521, 522, and 523 of the second layer 520 of the pad 500 may protrude toward the substrate 410. In other words, portions of a lower surface 510L of the first layer 510 respectively overlapping the patterns 521, 522, and 523 of the second layer 520 may protrude toward the substrate 410. As will be described below, a pressure may be applied from the bump 600 positioned on the pad 500 toward the pad 500 such that the bump 600 may be electrically connected to the pad 500. Because the portions of the lower surface 510L of the first layer 510 respectively overlapping the patterns 521, 522, and 523 may be pressed down in the process of electrically connecting the bump 600 to the pad 500, the portions of the lower surface 510L of the first layer 510 of the pad 500 respectively overlapping the patterns 521, 522, and 523 may protrude toward the substrate 410. In other words, the first layer 510 may include the portions protruding toward the substrate 410. Accordingly, the portions 511, 512, and 513 of the first layer 510 of the pad 500 protruding toward the substrate 410 may be positioned in the contact portion between the pad 500 and the bump 600, wherein the bump 600 overlaps the pad 500 in a plan view. Therefore, the portions 511, 512, and 513 of the first layer 510 of the pad 500 protruding toward the substrate 410 may be visually recognizable with a naked eye or a scope, so that the position of the contact portion between the pad 500 and the bump 600 may be examined (or verified).

A connection layer 700 may be disposed between the pad 500 and the bump 600. The connection layer 700 may electrically connect the pad 500 and the bump 600. In other words, the pad 500 and the bump 600 may be electrically connected to each other via the connection layer 700.

The connection layer 700 may include a mixture of a material of the pad 500 and a material of the bump 600. For example, in case that the third layer 530 of the pad 500 includes titanium (Ti) and the bump 600 includes gold (Au), the connection layer 700 may include a mixture of titanium and gold. As will be described below, the pad 500 and the bump 600 may be electrically connected to each other by a direct bonding, and surfaces of the pad 500 and the bump 600 which face each other may be softened and diffused in the direct bonding, so that the connection layer 700 may be formed between the pad 500 and the bump 600.

Figure 6:
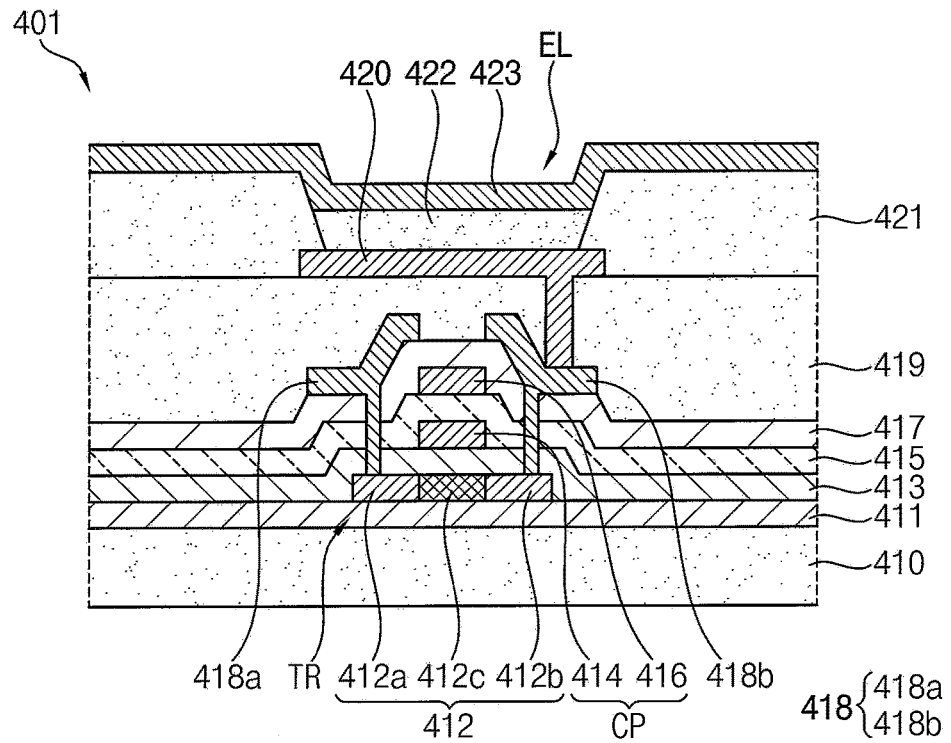
FIG. 6 is a schematic cross-sectional view illustrating a display substrate according to an embodiment.

FIG. 6 is a schematic cross-sectional view illustrating a display substrate according to an embodiment. FIG. 6 may illustrate another example of the active area AA of the display substrate 110 of FIG. 2.

Referring to FIG. 6, a display substrate 401 according to an embodiment may include a substrate 410 and a transistor TR, a capacitor CP, and a light emitting element EL disposed on the substrate 410. Descriptions on elements of the display substrate 401 described with reference to FIG. 6 that are substantially the same as or similar to those on the display substrate 400 described with reference to FIG. 3, are omitted.

A capacitor electrode 416 may be disposed between the gate electrode 414 and the insulation interlayer 417. The capacitor electrode 416 may overlap the gate electrode 414.

The capacitor electrode 416 may include a conductive material. For example, the capacitor electrode 416 may include molybdenum (Mo), copper (Cu), or the like. The capacitor electrode 416 may have a single-layer structure or a multilayer structure.

A capacitor insulation layer 415 may be disposed between the gate electrode 414 and the capacitor electrode 416. The capacitor insulation layer 415 may insulate the capacitor electrode 416 from the gate electrode 414. The capacitor insulation layer 415 may include an inorganic insulation material. For example, the capacitor insulation layer 415 may include silicon nitride, silicon oxide, silicon oxynitride, or the like. The capacitor insulation layer 415 may have a single-layer structure or a multilayer structure. The gate electrode 414, the capacitor insulation layer 415, and the capacitor electrode 416 may form the capacitor CP.

Figure 7:
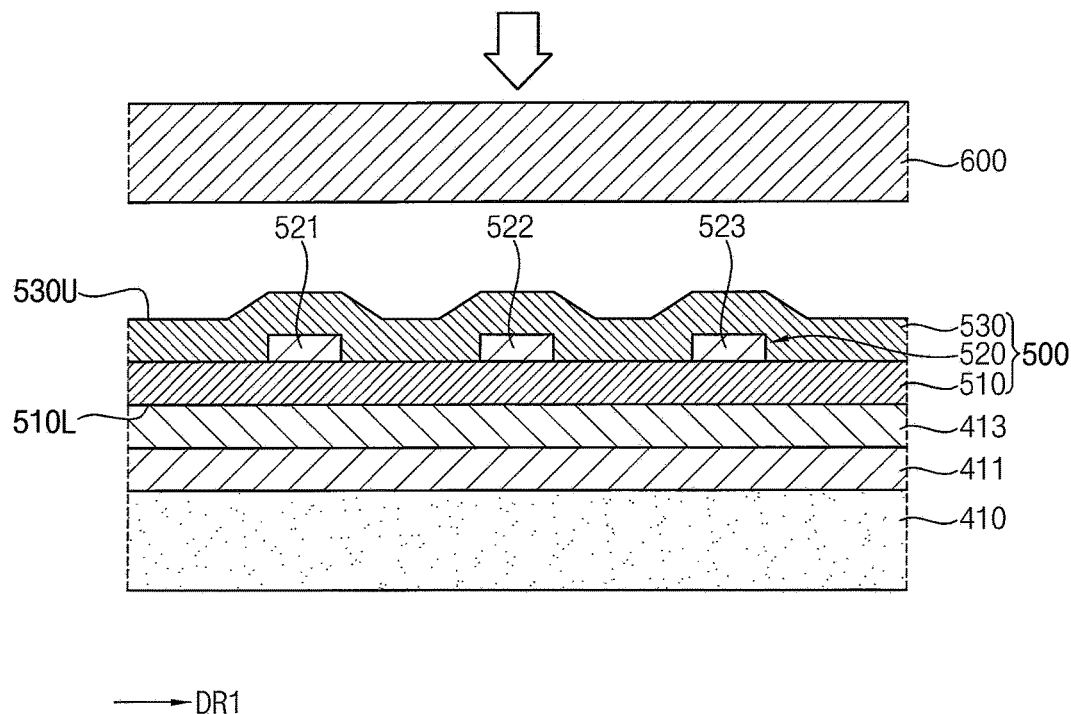
FIGS. 7 and 8 are schematic cross-sectional views illustrating a method of manufacturing a display device according to an embodiment.

In an embodiment, the first layer 510 and the gate electrode 414 may be disposed on a same layer; the second layer 520 and the capacitor electrode 416 may be disposed on a same layer; and the third layer 530 of the pad 500 and the source-drain electrode 418 may be disposed on a same layer (also refer to FIG. 7). In such an embodiment, the first layer 510 and the gate electrode 414 may be formed of a same material; the second layer 520 and the capacitor electrode 416 may be formed of a same material, and the third layer 530 of the pad 500 and the source-drain electrode 418 may be formed of a same material. The first layer, the second layer, and the third layer may be disposed on different layers.

Figure 8:
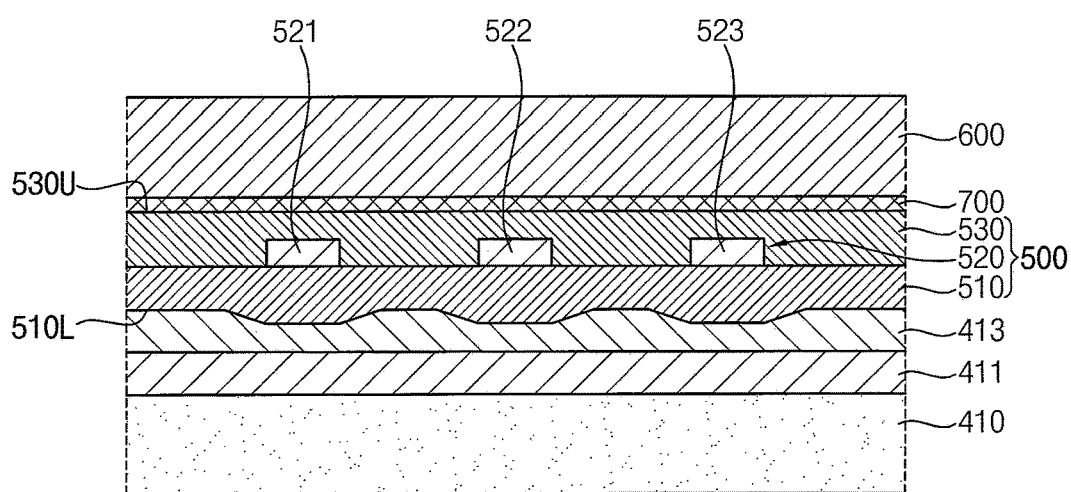

FIGS. 7 and 8 are schematic cross-sectional views illustrating a method of manufacturing a display device according to an embodiment.

Referring to FIG. 7, the pad 500 may be formed on the substrate 410, and the bump 600 may contact the pad 500.

First, the pad 500 including the first layer 510, the second layer 520, and the third layer 530 may be formed on the substrate 410.

The first layer 510 may be formed on the gate insulation layer 413. A lower surface 510L of the first layer 510 may be substantially flat. In an embodiment, the first layer 510 and the gate electrode 414 may be formed of a same material and substantially simultaneously.

The second layer 520 may be formed on the first layer 510. The second layer 520 may include the patterns 521, 522, and 523 arranged in the first direction DR1 and spaced apart from each other. In an embodiment, the second layer 520 and the insulation interlayer 417 may be formed of a same material and substantially simultaneously. In another embodiment, the second layer 520 and the capacitor electrode 416 may be formed of a same material and substantially simultaneously.

The third layer 530 may be formed on the second layer 520. The third layer 530 may be formed on the first layer 510, and may cover or overlap the patterns 521, 522, and 523 of the second layer 520. An upper surface 530U of the third layer 530 may be formed along a profile of an upper surface of the first layer 510 and upper surfaces and sidewalls of the patterns 521, 522, and 523. Accordingly, portions of the upper surface 530U of the third layer 530 respectively corresponding to the patterns 521, 522, and 523 may protrude toward the bump 600. In an embodiment, the third layer 530 and the source-drain electrode 418 may be formed of a same material and substantially simultaneously.

The bump 600 may contact the third layer 530 of the pad 500. A lower surface of the bump 600 may contact the upper surface 530U of the third layer 530 of the pad 500.

Referring to FIG. 8, the pad 500 may be electrically connected to the bump 600. The bump 600 may be electrically connected to the pad 500 with a direct bonding such as ultrasonic bonding or the like. For example, the bump 600 may be electrically connected to the pad 500 with an ultrasonic bonding in which a pressure and an ultrasound vibration are applied.

Since the pressure is applied from the bump 600 toward the pad 500 in the direct bonding process, the upper surface 530U of the third layer 530 of the pad 500 may be pressed by the bump 600. Portions of the third layer 530 respectively corresponding to the patterns 521, 522, and 523 of the second layer 520 may be pressed by the bump 600, and thus the patterns 521, 522, and 523 of the second layer 520 may press portions of the first layer 510 respectively corresponding to the patterns 521, 522, and 523 of the second layer 520. Accordingly, the portions of the first layer 510 respectively corresponding to the patterns 521, 522, and 523, which were flat before the bump 600 is electrically connected to the pad 500, may protrude toward the substrate 410 after the bump 600 is electrically connected to the pad 500.

The portions of the third layer 530 respectively corresponding to the patterns 521, 522, and 523 of the second layer 520 and pressed by the bump 600 may move to a side direction by a pressure applied from the bump 600. Accordingly, the third layer 530, in which the portions respectively corresponding to the patterns 521, 522, and 523 protruded toward the bump 600 before the bump 600 is electrically connected to the pad 500, may be relatively planarized after the bump 600 is electrically connected to the pad 500. In other words, the third layer 530 after electrically connecting the bump 600 to the pad 500 may be flatter than the third layer 530 before electrically connecting the bump 600 to the pad 500.

The connection layer 700 may be formed between the pad 500 and the bump 600 in the process of electrically connecting the bump 600 to the pad 500 with the direct bonding. For example, heat may be generated between surfaces of the pad 500 and the bump 600 which face each other by an ultrasound vibration in the ultrasonic bonding process. Therefore, the surfaces of the pad 500 and the bump 600 that face each other may be softened, and materials of the pad 500 and the bump 600 may be diffused. Accordingly, the connection layer 700 including a mixture of a material of the pad 500 and a material of the bump 600 may be formed between the pad 500 and the bump 600.

In a comparative example, a bump may be electrically connected to a pad with an indirect bonding, in which conductive particles are interposed between the pad and the bump. For example, an anisotropic conductive film including the conductive particles may be interposed between the pad and the bump, and the bump may be electrically connected to the pad with heat and/or pressure in a high temperature atmosphere. However, the display panel may be damaged in the high temperature atmosphere in the indirect bonding process, and a manufacturing cost of the display device may increase because of the additional anisotropic conductive film. However, in the embodiments of the invention, the bump 600 may be electrically connected to the pad 500 with the direct bonding such as an ultrasonic bonding or the like. As such, damages to the display panel can be prevented as a high temperature atmosphere is not required, and a manufacturing cost of the display device may decrease as the anisotropic conductive film is not required.

In the indirect bonding, because pressure marks are formed in the pad by the conductive particles, contact characteristics between the pad and the bump may be examined (or verified) by observing contact portions between the pad and the bump. However, in the direct bonding, because the conductive particles are not disposed between the pad 500 and the bump 600, the pressure marks by the conductive particles may not be formed in the pad 500. In the embodiments, the pad 500 may include the second layer 520 including the patterns 521, 522, and 523 between the first layer 510 and the third layer 530. Accordingly, pressure marks may be formed in portions of the first layer 510 respectively corresponding to the patterns 521, 522, and 523 in the process of electrically connecting the bump 600 to the pad 500 with the direct bonding. Therefore, contact characteristics between the pad 500 and the bump 600 may be examined (or verified) by observing contact portions between the pad 500 and the bump 600.

The display device according to the embodiments may be applied to a display device included in a computer, a notebook, a mobile phone, a smartphone, a smart pad, a PMP, a PDA, an MP3 player, or the like.

Although the display device and the method of manufacturing the display device according to the embodiments have been described with reference to the drawings, the illustrated embodiments are examples, and may be modified and changed by a person having ordinary skill in the relevant technical art without departing from the technical spirit described in the following claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device, comprising:
   a display panel including an insulation layer and a pad disposed on the insulation layer; and
   a driving unit including a bump electrically connected to the pad, wherein
   the pad includes:
      a first layer disposed directly on an upper surface of the insulation layer, the first layer including a conductive material;
      a second layer disposed on the first layer, the second layer including a plurality of patterns arranged in a first direction and spaced apart from each other; and
      a third layer disposed on the second layer, the third layer including a conductive material,
   the first layer includes surface portions protruding toward the insulation layer and respectively corresponding to the plurality of patterns, and
   the surface portions of the first layer are positioned above a lower surface of the insulation layer.

2. The display device of claim 1, wherein the second layer includes an insulation material.

3. The display device of claim 2, wherein the second layer includes at least one of silicon nitride, silicon oxide, and silicon oxynitride.

4. The display device of claim 1, wherein the second layer includes a conductive material.

5. The display device of claim 4, wherein the second layer includes at least one of molybdenum (Mo) and copper (Cu).

6. The display device of claim 1, wherein a width of each of the plurality of patterns in the first direction is greater than or equal to about 3 μm.

7. The display device of claim 1, wherein widths of the plurality of patterns in the first direction are equal to each other.

8. The display device of claim 1, wherein a width of each of the plurality of patterns in a second direction intersecting the first direction is equal to a width of the first layer in the second direction.

9. The display device of claim 1, wherein widths of the plurality of patterns in a second direction intersecting the first direction are equal to each other.

10. The display device of claim 1, wherein a gap between adjacent patterns of the plurality of patterns in the first direction is greater than or equal to a width of each of the plurality of patterns in the first direction.

11. The display device of claim 1, wherein a thickness of the second layer is in a range from about 1000 Å to about 10000 Å.

12. The display device of claim 1, wherein the third layer includes at least one of aluminum (Al), titanium (Ti), and copper (Cu).

13. The display device of claim 1, further comprising:
   a connection layer electrically connecting the bump to the pad and including a mixture of a material of the pad and a material of the bump.

14. The display device of claim 1, further comprising a transistor including:
   an active layer disposed on the substrate;
   a gate electrode disposed on the active layer;
   an insulation interlayer disposed on the gate electrode; and
   a source-drain electrode disposed on the insulation interlayer and electrically connected to the active layer.

15. The display device of claim 14, wherein
   the first layer and the gate electrode are disposed on a same layer,
   the second layer and the insulation interlayer are disposed on a same layer,
   the third layer and the source-drain electrode are disposed on a same layer, and
   the first layer, the second layer, and the third layer are disposed on different layers.

16. The display device of claim 14, further comprising a capacitor including:
   the gate electrode; and
   a capacitor electrode disposed between the gate electrode and the insulation interlayer.

17. The display device of claim 16, wherein
   the first layer and the gate electrode are disposed on a same layer,
   the second layer and the capacitor electrode are disposed on a same layer,
   the third layer and the source-drain electrode are disposed on a same layer, and
   the first layer, the second layer, and the third layer are disposed on different layers.

18. A display device, comprising:
   a display panel including an insulation layer and a pad disposed on the insulation layer; and
   a driving unit including a bump electrically connected to the pad, wherein
   the pad includes:
      a first layer disposed directly on an upper surface of the insulation layer, the first layer including a conductive material;
      a second layer disposed on the first layer, the second layer including a plurality of patterns arranged in a first direction and spaced apart from each other; and
      a third layer disposed on the second layer, the third layer including a conductive material, the first layer includes portions protruding toward the insulation layer and respectively corresponding to the plurality of patterns, and the portions of the first layer are physically connected to each other.

19. The display device of claim 18, wherein the portions of the first layer do not extend to another layer below the insulation layer.

20. The display device of claim 18, wherein the portions of the first layer are visually recognizable.

* * * * *